US010950661B2

(12) United States Patent
Wang et al.

(10) Patent No.: US 10,950,661 B2
(45) Date of Patent: Mar. 16, 2021

(54) INTEGRATED CIRCUITS WITH RESISTIVE NON-VOLATILE MEMORY CELLS AND METHODS FOR PRODUCING THE SAME

(71) Applicant: Globalfoundries Singapore Pte. Ltd., Singapore (SG)

(72) Inventors: Lanxiang Wang, Singapore (SG); Shyue Seng Tan, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 6 days.

(21) Appl. No.: 16/376,099

(22) Filed: Apr. 5, 2019

(65) Prior Publication Data

US 2020/0321396 A1    Oct. 8, 2020

(51) Int. Cl.
| | |
|---|---|
| *H01L 23/528* | (2006.01) |
| *H01L 43/02* | (2006.01) |
| *H01L 43/08* | (2006.01) |
| *H01L 43/12* | (2006.01) |
| *H01L 27/24* | (2006.01) |
| *H01L 45/00* | (2006.01) |

(52) U.S. Cl.
CPC ...... *H01L 27/2463* (2013.01); *H01L 27/2436* (2013.01); *H01L 45/08* (2013.01); *H01L 45/1233* (2013.01); *H01L 45/1253* (2013.01); *H01L 45/146* (2013.01); *H01L 45/1616* (2013.01)

(58) Field of Classification Search
None
See application file for complete search history.

(56) References Cited

U.S. PATENT DOCUMENTS

| | | | | |
|---|---|---|---|---|
| 2010/0259976 A1* | 10/2010 | Abedifard | ............... | G11C 8/16 |
| | | | | 365/171 |
| 2013/0094282 A1* | 4/2013 | Hu | ...................... | G11C 11/5607 |
| | | | | 365/158 |
| 2013/0258750 A1* | 10/2013 | Kim | ................... | G11C 11/1659 |
| | | | | 365/145 |
| 2017/0092693 A1* | 3/2017 | Tan | ........................ | H01L 43/08 |

OTHER PUBLICATIONS

Kim et al., "Low Power Operating Bipolar TMO ReRAM for Sub 10 nm Era", IEEE, 2000, 4 pages.

(Continued)

*Primary Examiner* — Joseph C. Nicely
*Assistant Examiner* — Lamont B Koo
(74) *Attorney, Agent, or Firm* — Thompson Hine LLP

(57) ABSTRACT

Integrated circuits and methods of producing the same are provided. In an exemplary embodiment, an integrated circuit includes a memory cell, wherein the memory cell includes a transistor having a source and a drain, a first resistive unit in electrical communication with the source, and a second resistive unit in electrical communication with the drain. The first resistive unit includes a first bottom electrode, a first top electrode, and a first resistive element positioned between the first bottom electrode and the first top electrode. The second resistive unit includes a second bottom electrode, a second top electrode, and a second resistive element positioned between the second bottom electrode and the second top electrode.

20 Claims, 7 Drawing Sheets

(56) References Cited

OTHER PUBLICATIONS

Kim et al., "Improvement of Characteristics of NbO2 Selector and Full Integration of 4F2 2x-nm tech 1S1R ReRAM", IEEE, 2015, 4 pages.
Nakayama, "ReRAM technologies: Applications and outlook", IEEE, 2017, 4 pages.
Traore et al., "Investigation of the role of electrodes on the retention performance of HfOx based RRAM cells by experiments, atomistic simulations and device physical modeling", IEEE, 2013, 6 pages.
Tseng et al., "High Density and Ultra Small Cell Size of Contact ReRAM (CR-RAM) in 90nrn CMOS Logic Technology and Circuits", IEEE, 2009, 4 pages.
Wang et al., "Functionally Complete Boolean Logic in 1T1R Resistive Random Access Memory", IEEE Electron Device Letters, Feb. 2017, pp. 179-182, vol. 38, No. 2.
Wei et al., "Highly Reliable TaOx ReRAM and Direct Evidence of Redox Reaction Mechanism", 4 pages.
Wong et al, "Metal—Oxide RRAM", Proceedings of the IEEE, Jun. 2012, pp. 1951-1970, vol. 100, No. 6.

\* cited by examiner

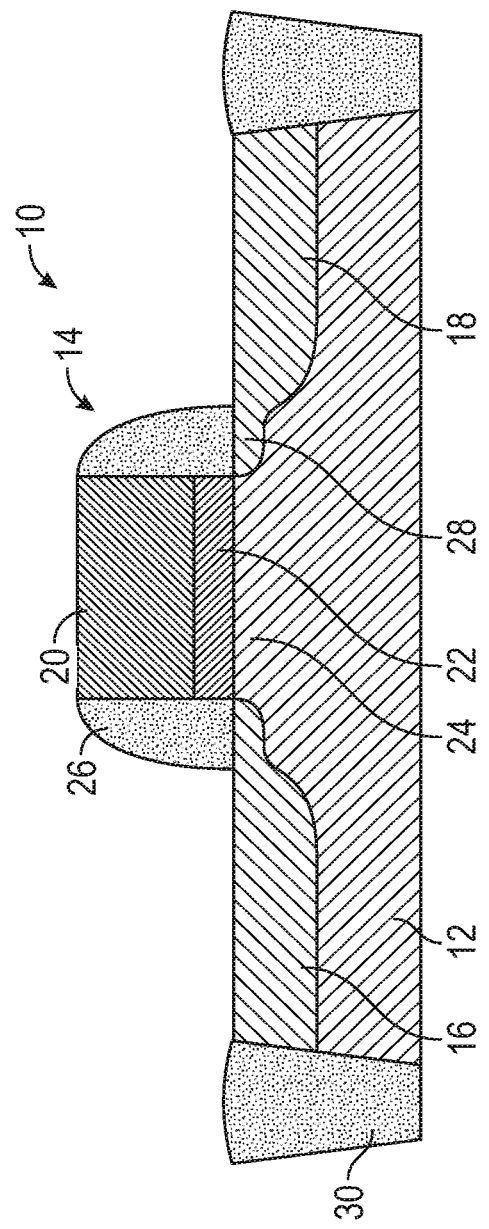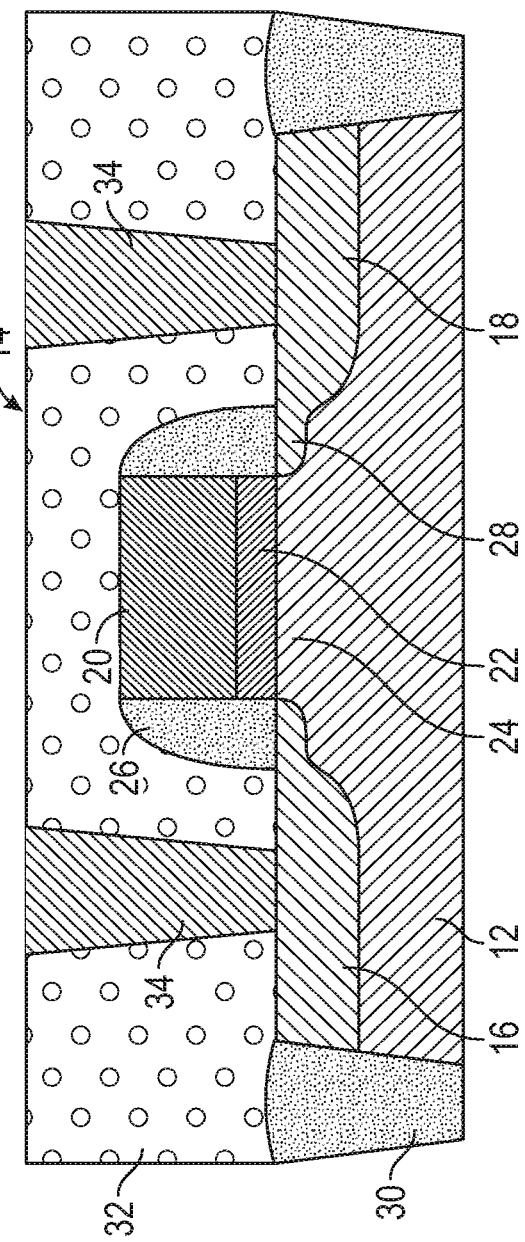

INTEGRATED CIRCUITS WITH RESISTIVE NON-VOLATILE MEMORY CELLS AND METHODS FOR PRODUCING THE SAME

TECHNICAL FIELD

The technical field generally relates to integrated circuits with non-volatile memory cells and methods of producing the same, and more particularly relates to integrated circuits with non-volatile memory cells including two resistive memory units, and methods of producing the same.

BACKGROUND

Non-volatile memory cells retain their stored data, even when the power supply is removed. Therefore, non-volatile memory cells are desirable for devices that may be turned on and off during normal use. A resistive memory cell is a structure that includes a resistive element positioned between two electrodes, where the resistance of the resistive element is variable. The resistance of the resistive element can be switched between a high resistance state and a low resistance state, where conductive "filaments" are presumed to form within the resistive element in the low resistive state, and the conductive "filaments" are ruptured or broken in the high resistive state. The "filaments" are presumed to form from a dielectric breakdown where atoms are oxidized in the filament such that the resistance is reduced, so the "filaments" are presumed to be atomic level structures resulting from a local chemical change. A set voltage applied to the electrodes can form the conductive "filaments" so the resistive element is set into the low resistive state. A different reset voltage can be applied to the electrodes to rupture the conductive "filaments," so the resistive element is reset into the high resistive state. This process can be performed repeatedly. The memory cell is read by measuring the resistance of the resistive unit.

A cell window measures the change in resistance in the memory cell between the high and low resistive states. More particularly, the cell window is ten times the resistance in the high resistance state divided by the resistance in the low resistance state. The larger the cell window, the easier it is to read the memory cell. Larger cell windows also provide more reliable reading operations. Known resistive memory units typically include a transistor and one resistive memory unit, and the cell window is about 10. Devices and methods of producing resistive memory cells with larger cell windows are desirable to increase the ease of use and reliability of the integrated circuits.

Accordingly, it is desirable to provide integrated circuits and methods of producing the same with resistive memory cells that have larger cell windows, such as cell windows of about 15 or more. In addition, it is desirable to provide integrated circuits with resistive memory cells having larger cell windows without increasing the footprint or area required for the resistive memory cell, and methods for producing the same. Furthermore, other desirable features and characteristics of the present embodiments will become apparent from the subsequent detailed description and the appended claims, taken in conjunction with the accompanying drawings and this background.

BRIEF SUMMARY

Integrated circuits and methods of producing the same are provided. In an exemplary embodiment, an integrated circuit includes a memory cell, wherein the memory cell includes a transistor having a source and a drain, a first resistive unit in electrical communication with the source, and a second resistive unit in electrical communication with the drain. The first resistive unit includes a first bottom electrode, a first top electrode, and a first resistive element positioned between the first bottom electrode and the first top electrode. The second resistive unit includes a second bottom electrode, a second top electrode, and a second resistive element positioned between the second bottom electrode and the second top electrode.

An integrated circuit is provided in another exemplary embodiment. The integrated circuit includes a memory cell, where the memory cell includes a transistor having a source and a drain. The memory cell also includes a first resistive unit and a second resistive unit. The integrated circuit further includes a first source line, a second source line, and a bit line. The first resistive unit is in electrical communication with the first source line and the second source line, and the first source line is in electrical communication with the source. The second resistive unit is in electrical communication with the drain and with the bit line.

A method of producing an integrated circuit is provided in another embodiment. The method includes forming a transistor having a source and a drain, and forming a first source line in electrical communication with the source. A first resistive unit is formed in electrical communication with the first source line, where the first resistive unit includes a first bottom electrode, a first resistive element overlying the first bottom electrode, and a first top electrode overlying the first resistive element. A second resistive unit is formed in electrical communication with the drain, where the second resistive unit includes a second bottom electrode, a second resistive element overlying the second bottom electrode, and a second top electrode overlying the second resistive element. A second source line is formed in electrical communication with the first top electrode of the first resistive unit.

BRIEF DESCRIPTION OF THE DRAWINGS

The present embodiments will hereinafter be described in conjunction with the following drawing figures, wherein like numerals denote like elements, and wherein:

FIGS. 1-5 are cross sectional views of embodiments of an integrated circuit, and methods for producing the same;

DETAILED DESCRIPTION

Figure 3:
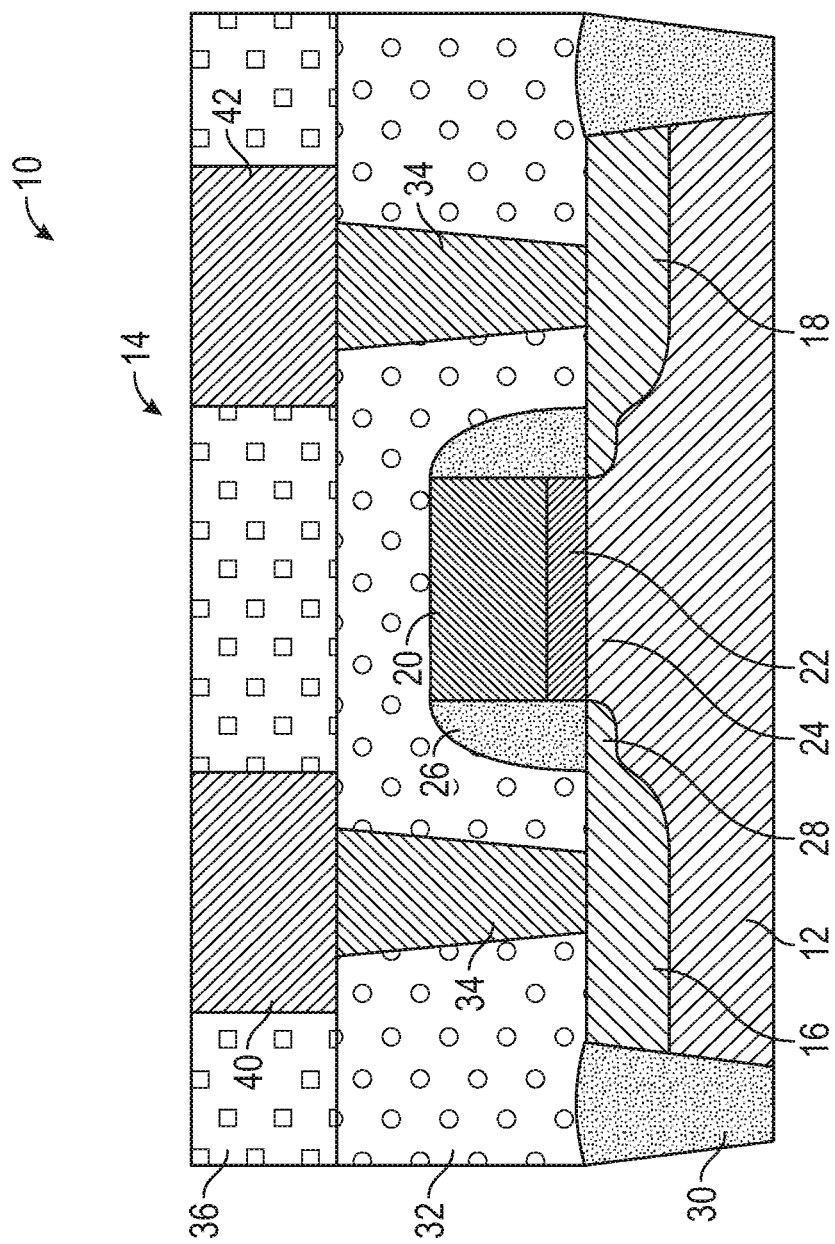

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes a resistive memory cell with one transistor and two resistive units. One of the two resistive units is in electrical communication with a drain of the transistor, and the other resistive unit is in electrical communication with a source of the transistor. The integrated circuit includes a word line, a bit line, and two different source lines for implementing the resistive unit that is in electrical communication with the source. The memory cell with two resistive units has a cell window that is larger than comparable memory cells with only one resistive unit. In an exemplary embodiment, the two resistive unit memory cell may have a cell window of about 19, compared to a cell window of about 10 for a resistive memory cell with one resistive unit. The memory cell with two resistive units is capable of being produced with about the same footprint as a memory cell with one resistive unit, in part because some of the components overlie the transistor so no additional horizontal space (i.e., footprint) is needed.

Reference is made to FIG. 1, where one possible manufacturing process is illustrated and described. It is to be understood that several other possible manufacturing processes could be utilized to produce comparable structures, and the exemplary embodiment illustrated in FIGS. 1-5 provides a general roadmap for those skilled in the art. An integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. In many embodiments, the substrate 12 primarily includes a monocrystalline semiconductor material. The term "primarily includes," as used herein, means the specified material is present in the specified component at a concentration of at least about 50 weight percent, based on a total weight of the component. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

A transistor 14 is formed, where the transistor includes a source 16, a drain 18, a gate dielectric 22, a gate 20 overlying the gate dielectric 22, and a channel 24 underlying the gate dielectric 22. As used herein, the term "overlying" means "over" such that an intervening layer may lie between the overlying component (the gate 20 in this example) and the underlying component (the gate dielectric 22 in this example), or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of FIGS. 1-5. It is to be understood that spatially relative terms refer to the orientation in FIGS. 1-5, so if the integrated circuit 10 were to be oriented in another manner the spatially relative terms would still refer to the orientation depicted in FIGS. 1-5. Thus, the exemplary terms "over" and "under" remain the same even if the device is twisted, flipped, or otherwise oriented other than as depicted in FIGS. 1-5.

In the illustrated embodiment, the source 16 and drain 18 are formed within the substrate 12, but the source 16 and drain 18 may be formed overlying the substrate 12 in alternate embodiments (not illustrated). Other types of transistors may also be utilized in various embodiments, such as a finned field effect transistor (Fin FET) (not illustrated) or a gate-all-around field effect transistor (not illustrated). A pair of spacers 26 are formed on opposite sides of the gate 20 and gate dielectric 22 in an exemplary embodiment, and the source 16 and drain 18 optionally include an extension well 28 underlying the spacers 26. The transistor 14 is positioned between isolation structures 30 in an exemplary embodiment.

The source 16, drain 18, and gate 20 are electrically conductive in an exemplary embodiment, and the gate dielectric 22, the spacers 26, and the isolation structures 30 are electrically insulating. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. The gate dielectric 22, the spacers 26, and the isolation structures 30 may include silicon dioxide in an exemplary embodiment, but one or more of these components may include silicon nitride or other electrically insulating materials in various embodiments. The source 16 and drain 18 may include monocrystalline silicon with conductivity determining impurities (i.e., dopants) at a concentration sufficient to render the source 16 and drain 18 electrically conductive. The gate 20 may include polycrystalline silicon with a sufficient concentration of conductivity determining impurities sufficient to render the gate electrically conductive. Other materials may be utilized for the various components in alternate embodiments, as mentioned above. The transistor 14 is formed using known techniques.

A first interlayer dielectric layer 32 is formed overlying the substrate 12 and the transistor 14, as illustrated in FIG. 2. The first interlayer dielectric layer 32 (and other interlayer dielectric layers described below) may include a wide variety of electrically insulating materials in various embodiments. For example, un-doped silicate glass (USG), silicon nitride, silicon oxynitride, silicon dioxide, low K dielectric materials, combinations thereof, and other materials may be used. In an exemplary embodiment, silicon dioxide is deposited by chemical vapor deposition using silane and oxygen, but other techniques and/or materials are utilized in alternate embodiments. Contacts 34 are formed in the first interlayer dielectric layer 32, wherein one or more contact(s) 34 are in electrical communication with the source 16 and one or more other contact(s) 34 is in electrical communication with the drain 18. The contacts 34 are electrically conductive. The term "electrical communication," as used herein, means electrical current is capable of flowing from one component to another, where the electrical current may or may not flow through an electrically conductive intervening component, but two components are not in "electrical communication" if the electrical current must flow through an electrically insulating or electrically semiconductive intervening component. The term "direct electrical contact," as used herein, means direct physical contact between components that are electrically conductive or semiconductors, but not electrical insulators. Components that may transition between being (1) electrically conductive or electrically semiconductive and (2) electrically insulating, such as the resistive elements described below, are considered as an electrical insulator in this description such that "electrical communication," as used herein, does not flow through such a component. Therefore, electrically conductive components are not in electrical communication if they are physically separated by a component that transitions between being (1) electrically conductive or electrically semiconductive and (2) electrically insulating (such as the resistive elements described below.) As such, the source 16 and drain 18 are not in electrical communication if the current must flow therebetween through the semiconductive substrate 12 or channel 24.

The contacts 34 illustrated in FIG. 2 and described below may be formed by lithographically isolating a desired location on the first interlayer dielectric layer 32 (or other interlayer dielectric layers described below), and then etching a trench (not illustrated as an open trench) within the first interlayer dielectric layer 32, or other interlayer dielectric layers described below. The contact 34 is then formed within the trench. In an exemplary embodiment, the contacts 34 include an adhesion layer, a barrier layer, and a plug (not individually shown), which are sequentially deposited. In an exemplary embodiment, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Overburden may then be removed, such as with chemical mechanical planarization. Other types of contacts are also possible, such as copper or other conductive materials.

As shown in FIG. 3, a second interlayer dielectric layer 36 is formed overlying the first interlayer dielectric layer 32, and interconnects are formed in the second interlayer dielectric layer 36. The interconnects include a first source line 40 in electrical communication with the source 16, and a drain connection line 42 in electrical communication with the drain 18. In an exemplary embodiment, the first source line 40, the drain connection line 42, and other interconnects described below may be formed from copper, but other electrically conductive materials may be utilized in alternate embodiments. The copper may be deposited using a damascene process by lithographically forming a trench (not individually illustrated) depositing copper by electroless or electrolytic plating from a solution such as a sulfuric acid copper bath, and subsequent chemical mechanical planarization to remove the copper overburden overlying the second interlayer dielectric layer 36 outside of the trenches.

Figure 4:
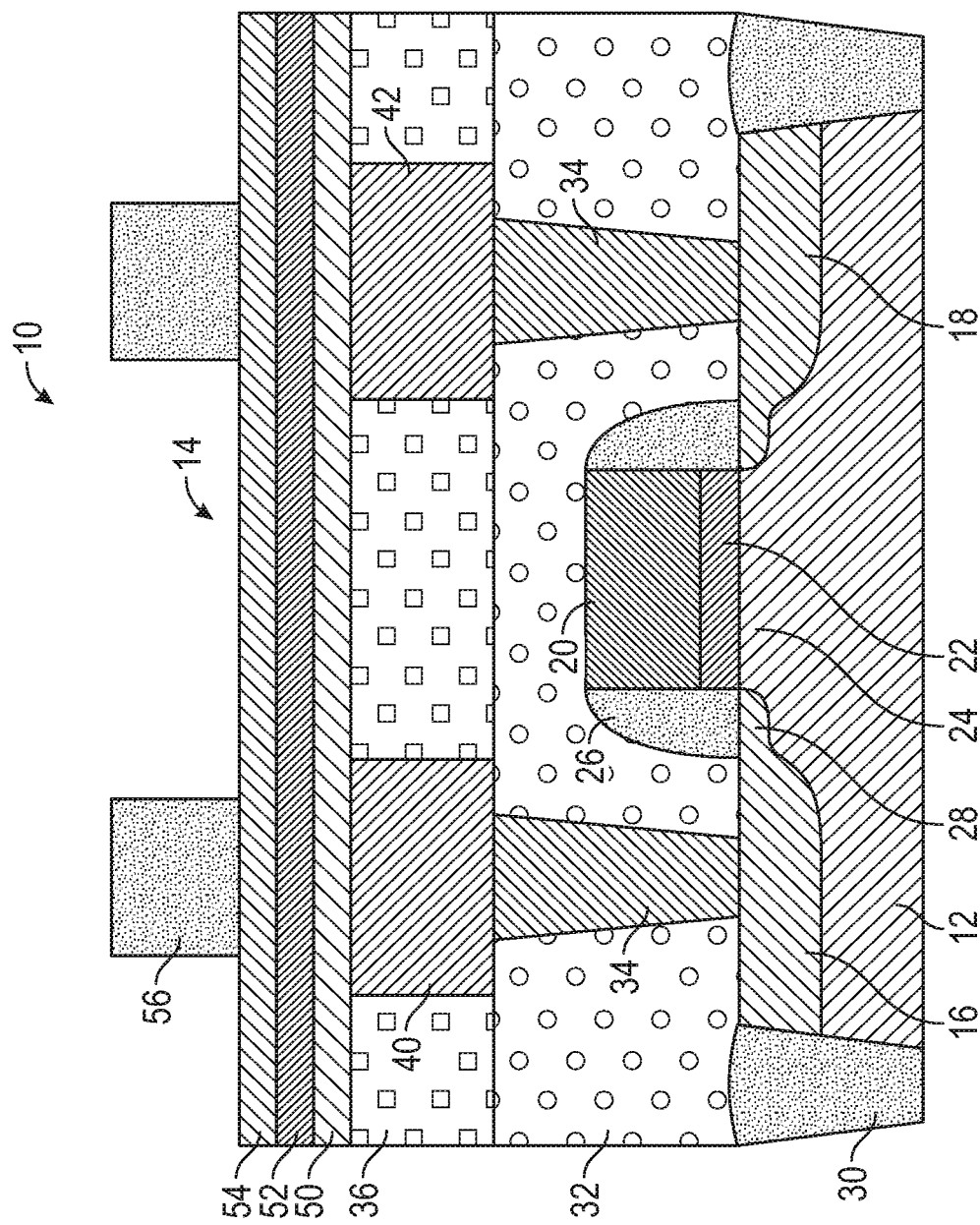

Referring to FIG. 4, a bottom electrode layer 50, a resistive element layer 52, and a top electrode layer 54 are sequentially formed overlying the second interlayer dielectric layer 36. In some embodiments, there may be more or less than two interlayer dielectric layers underlying the bottom electrode layer 50. The bottom and top electrode layers 50, 54 are electrically conductive, and may include platinum, titanium, titanium nitride, or other conductive materials in various embodiments. Platinum may be deposited by chemical vapor deposition using trimethyl methylcyclopentadienyl platinum, but other materials or deposition techniques may be utilized in alternate embodiments. The resistive element layer 52 may be formed from many different materials, such as nickel oxide, titanium oxide, zinc oxide, zirconium oxide, hafnium oxide, or other materials. Nickel oxide may be formed by atomic layer deposition using Ni(dmamp)$_2$, also known as nickel di(dimethylamino-2-methyl-2-propanolate)$_2$. The composition of the top and bottom electrode layers 50, 54 and the resistive element layer 52 will determine the composition of the resistive unit, described below. Other optional layers (not illustrated) may also optionally be formed in various embodiments, such as a buffer layer that includes titanium underlying the bottom electrode layer 50.

A resistive photoresist layer 56 is formed and patterned overlying the top electrode layer 54. The resistive photoresist layer 56 (and other photoresist layers described above and below) may be deposited by spin coating and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the resistive photoresist layer 56 remains overlying the other areas of the top electrode layer 54. The resistive photoresist layer 56 (and other photoresist layers described above and below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane. The resistive photoresist layer 56 may be patterned to remain overlying the first source line 40 and the drain connection line 42.

Figure 5:
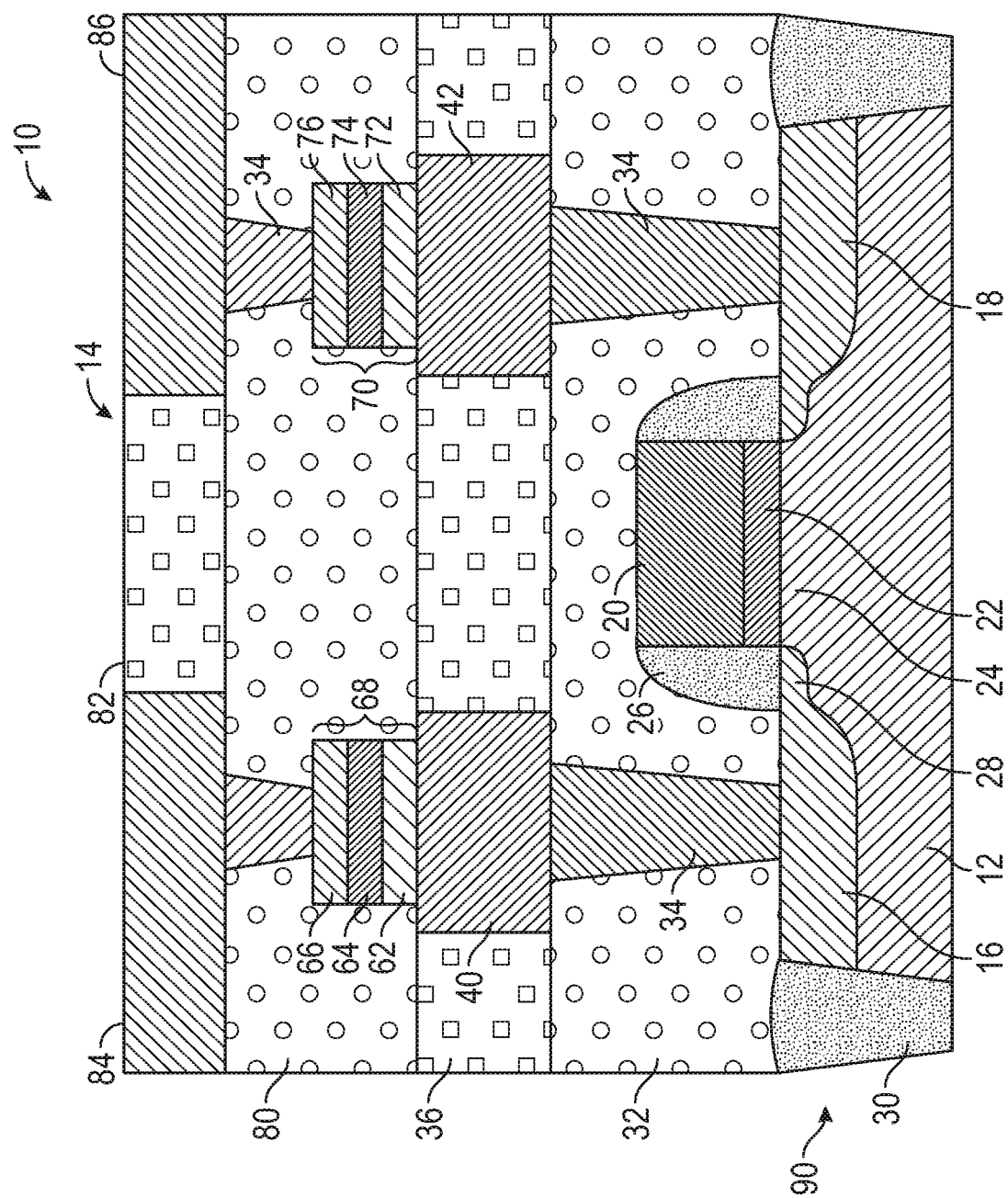

The top electrode layer 54, the resistive element layer 52, and the bottom electrode layer 50 are then anisotropically etched to produce a first resistive unit 60 and a second resistive unit 70, as illustrated in FIG. 5 with continuing reference to FIG. 4. The first resistive unit 60 includes a first bottom electrode 62, a first resistive element 64 overlying the first bottom electrode 62, and a first top electrode 66 overlying the first resistive element 64. In a similar manner, the second resistive unit 70 includes a second bottom electrode 72, a second resistive element 74 overlying the second bottom electrode, and a second top electrode 76 overlying the second resistive element 74. As such, the first and second resistive elements 64, 74 are sandwiched between the first bottom and first top electrodes 62, 66, and the second bottom and second top electrode 72, 76, respectively.

The first bottom electrode 62 is not in electrical communication with the first top electrode 66, because they are separated by the first resistive element 64. The first resistive element 64 is formed from a material with a variable resistance, where the first resistive element 64 may form "filaments" such that the first resistive element 64 is electrically conductive. This is a first low resistance for the first resistive element 64, and also for the first resistive unit 60. The first resistive element 64 may also be modified by rupturing the "filaments" such that the first resistive element 64 has a first high resistance and is an electrical insulator. This is a first high resistance for the first resistive element 64 and also for the first resistive unit 60. The second resistive element 74 has the same properties, so the second bottom electrode 72 is not in electrical communication with the second top electrode 76. The second resistive element 74 and second resistive element 74 have a second high resistance and a second low resistance. It is understood that when the first and/or second resistive elements 64, 74 are in an electrically conductive or semiconductive state, current can flow between the first and second top and bottom electrodes 62, 72, 66, 76, but as defined above for this disclosure, the resistive elements 64, 74 are defined to break electrical communication as an insulator. This definition applies to the resistive elements 64, 74, regardless of whether they are in a high or low resistive state, so that a consistent description can be employed.

As can be seen, the first bottom electrode 62 is in electrical communication with the first source line 40 and the source 16. In a similar manner, the second bottom electrode 72 is in electrical communication with the drain connection line 42 and drain 18. Also, as noted above, the source 16 and drain 18 are not in electrical communication with each other, because they are separated by the semiconductive channel 24. In an exemplary embodiment, a third interlayer dielectric layer 80 is formed overlying the second interlayer dielectric layer 36 and the first and second resistive units 60, 70. Different contacts 34 are formed through the third interlayer dielectric layer 80 to the first and second top electrodes 66, 76. In the embodiment illustrated in FIG. 5, the first and second resistive units 60, 70 are within the third interlayer dielectric layer 80. However, in alternate embodiments (not illustrated) the first and second resistive units 60, 70 may be within the same interlayer dielectric layer, and that interlayer dielectric layer that includes the first and second resistive units 60, 70 may be an interlayer dielectric layer that is different than the third interlayer dielectric layer 80, such as the second, fourth, fifth, sixth, etc. interlayer dielectric layer.

A fourth interlayer dielectric layer 82 is then formed overlying the third interlayer dielectric layer 80 in the illustrated embodiment, and a second source line 84 and a bit line 86 are formed in the fourth interlayer dielectric layer 82. As such, the first and second source lines 40, 84 are in different interlayer dielectric layers. In an embodiment, the second source line 84 is in an interlayer dielectric layer (the fourth interlayer dielectric layer 82 in the illustrated embodiment) and the first source line 40 is in an interlayer dielectric layer (the second interlayer dielectric layer 36 in the illustrated embodiment) that underlies the interlayer dielectric layer that the second source line 84 is within. Furthermore, the second source line 84 overlies the first source line 40 in an exemplary embodiment, at least in some area of the integrated circuit 10 (such as above and below the first resistive unit 60.) The second source line 84 and the bit line 86 are electrically conductive. The second source line 84 is formed in electrical communication with the first top electrode 66, and the bit line 86 is formed in electrical communication with the second top electrode 76. The first resistive unit 60 includes both the first bottom and top electrodes 62, 66, so the first resistive unit 60 is in electrical communication with both the first and second source lines 40, 84 because the first bottom electrode 62 of the first resistive unit 60 is in electrical communication with the first source line 40, and the first top electrode 66 of the first resistive unit 60 is in electrical communication with the second source line 84. However, the first and second source lines 40, 84 are not in electrical communication with each other through the first resistive unit 60, because they are separated by the first resistive element 64. In a similar manner, the second resistive unit 70 is in electrical communication with both the bit line 86 and the drain 18, but the bit line 86 and the drain 18 are not in electrical communication with each other through the second resistive unit 70.

A memory cell 90 of the integrated circuit 10 includes the transistor 14 and the first and second resistive units 60, 70. In fact, the memory cell 90 includes only one transistor 14 and a total of two resistive units, which are the first and second resistive units 60, 70. The memory cell 90 may also include portions of other components, such as portions of the first and second source lines 40, 84, the bit line 86, and the gate 20 which may function as a word line for the memory cell 90. However, some of the components may be shared by more than one memory cell 90. For example, several different memory cells 90 within a memory bank of the integrated circuit 10 may share the first source line 40, and other memory cells 90 may share the second source line 84, and yet other memory cells 90 may share the bit line 86. The gate 20, which may function as the word line, may extend over an isolation structure 30 (not specifically illustrated), such that one continuous, unbroken word line may functions as a gate 20 for a plurality of different transistors 14 in different memory cells 90. The interaction of the components that may be shared by different memory cells 90 is discussed in greater detail below.

Figure 6:
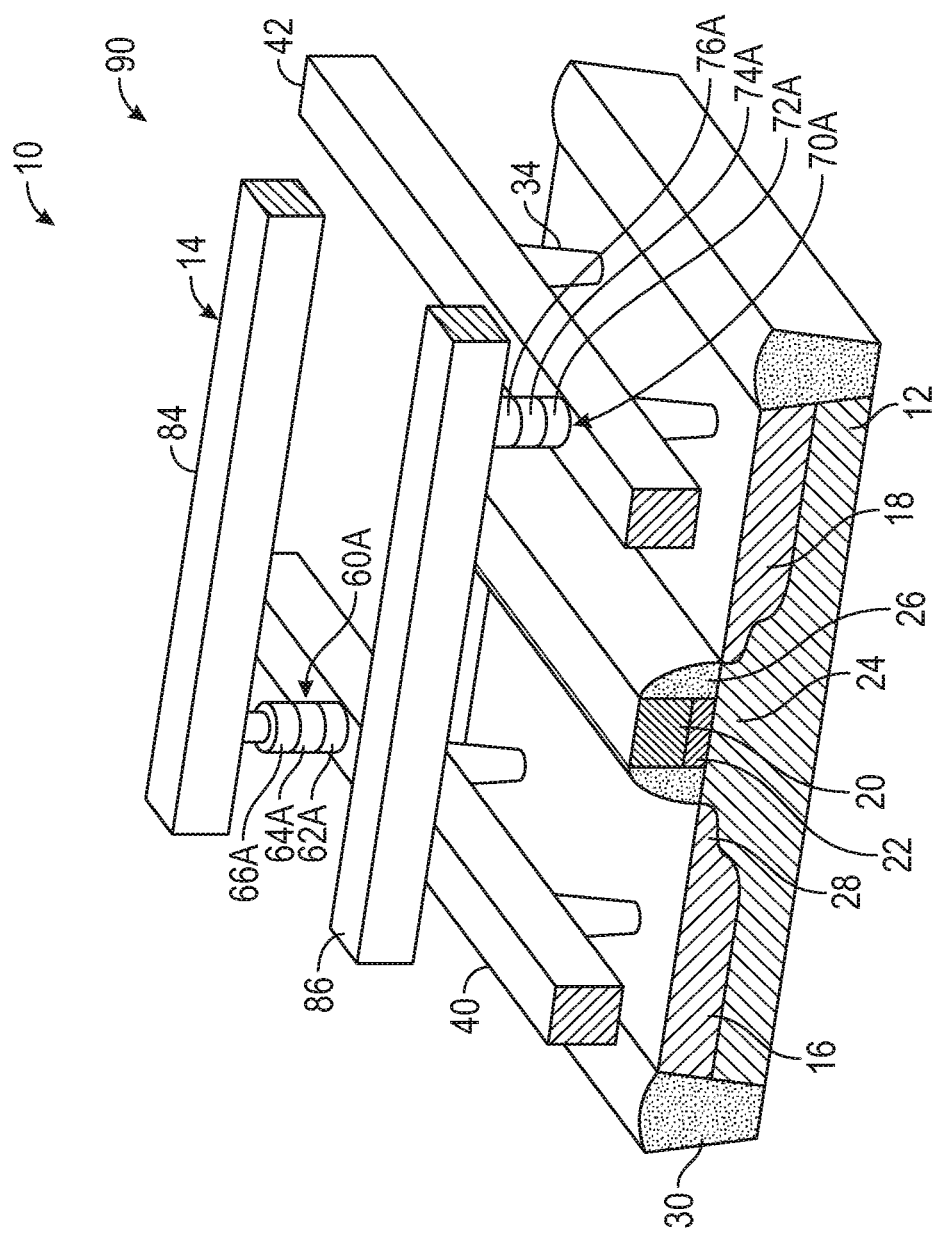
FIGS. 6 and 7 are perspective sectional views of different embodiments of an integrated circuit, where interlayer dielectric layers are removed for clarity.

FIG. 6 is a perspective view of an embodiment of the integrated circuit, where the interlayer dielectric layers are not shown to better illustrate the other components. In the embodiment illustrated in FIG. 6, the first and second resistive units 60A, 70A are on the same level, meaning they are about the same distance above a top surface of the substrate 12. The first resistive unit 60A is positioned between the first source line 40 and the second source line 84. The second resistive unit 70A is positioned between the drain connection line 42 and the bit line 86. In this embodiment, the first resistive unit 60A is set back from the second resistive unit 70A, relative to the front portion of FIGS. 1-5, but the first and second resistive units 60A, 70A have the same electrical connections, and the same components are in electrical communication as described above. In this embodiment, the first and second resistive units 60A, 70A may have the same composition, such that the first bottom electrode 62A and the second bottom electrode 72A have about the same composition. In a similar manner, the first resistive element 64A and the second resistive element 74A have about the same composition, and the first top electrode 66A and the second top electrode 76A have about the same composition. Furthermore, the first high resistance and the first low resistance are about the same as the second high resistance and the second low resistance, respectively. The components of the first and second resistive units 60, 70 may be formed at the same time for the same layers, as illustrated in FIG. 4, so the compositions are about the same.

Figure 7:
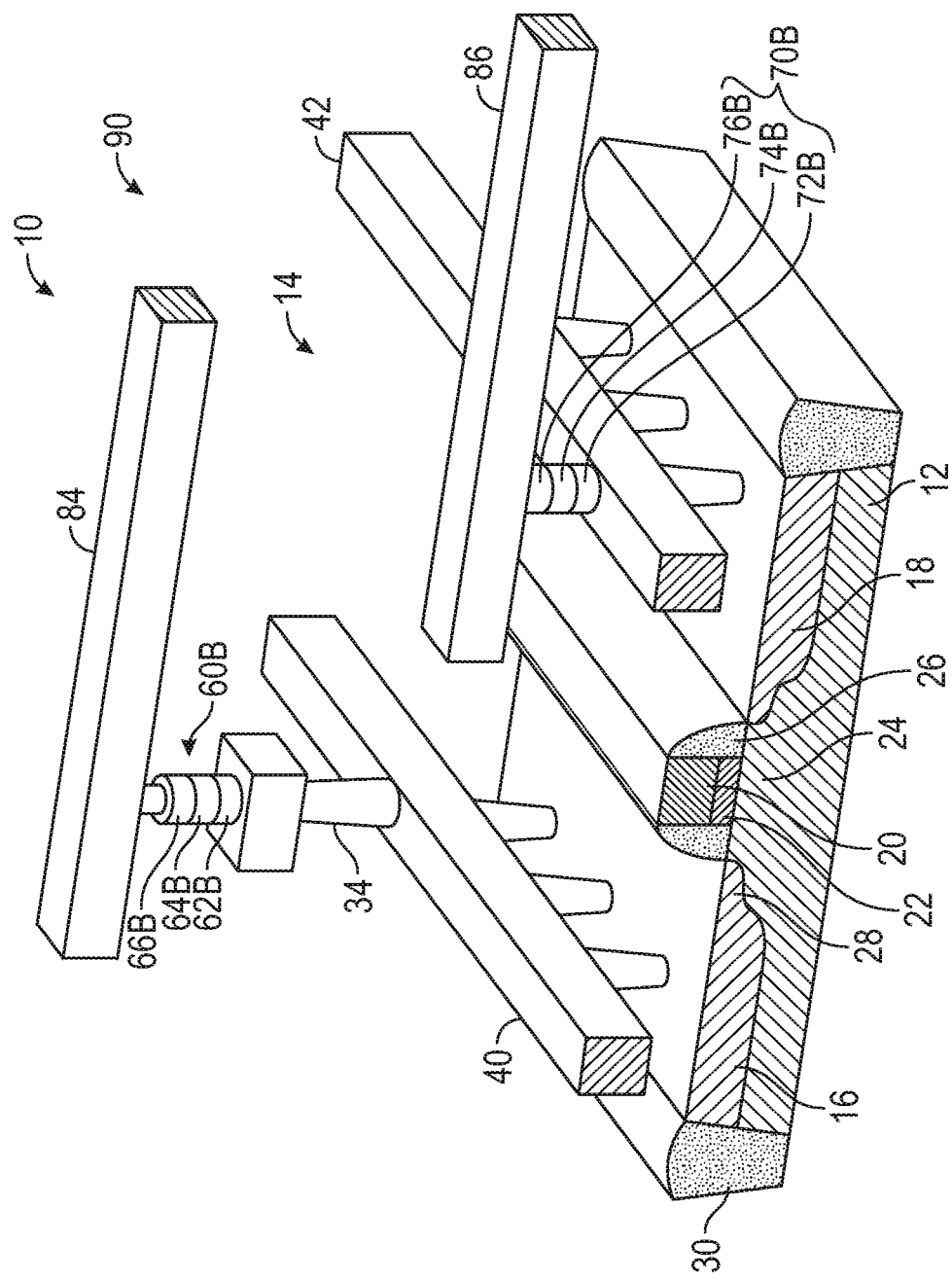

Referring now to FIG. 7, with continuing reference to FIG. 6, the first and second resistive units 60B, 70B are on different levels, relative to the surface of the substrate 12. In this embodiment, the compositions of the first and second resistive units 60B, 70B may be different from each other. The different levels are formed at different times, so different components can be incorporated into the first and second resistive units 60B, 70B. For example, the first top and bottom electrodes 62B, 66B may primarily include platinum, and the first resistive element 64B may primarily include nickel oxide, but the second bottom electrode 72B may primarily include titanium nitride, the second resistive element 74B may primarily include zinc oxide, and the second top electrode 76B may primarily include platinum. A wide variety of other compounds may be included in the first and second resistive units 60, 70 in various embodiments. It is also possible to provide different compositions for the first and second resistive units 60B, 70B on the same level, using masking techniques, but that embodiment is not specifically illustrated herein. Furthermore, the thicknesses of the components of the first and second resistive units 60B, 70B may be different. For example, the first resistive element 64B may be thinner than the second resistive element 74B, so the first and second high resistance and the first and second low resistance may be different even if the compositions of the components are about the same. In a similar manner, if the compositions of the components are different, the first and second high resistance and the first and second low resistance may also be different from each other.

Figure 8:
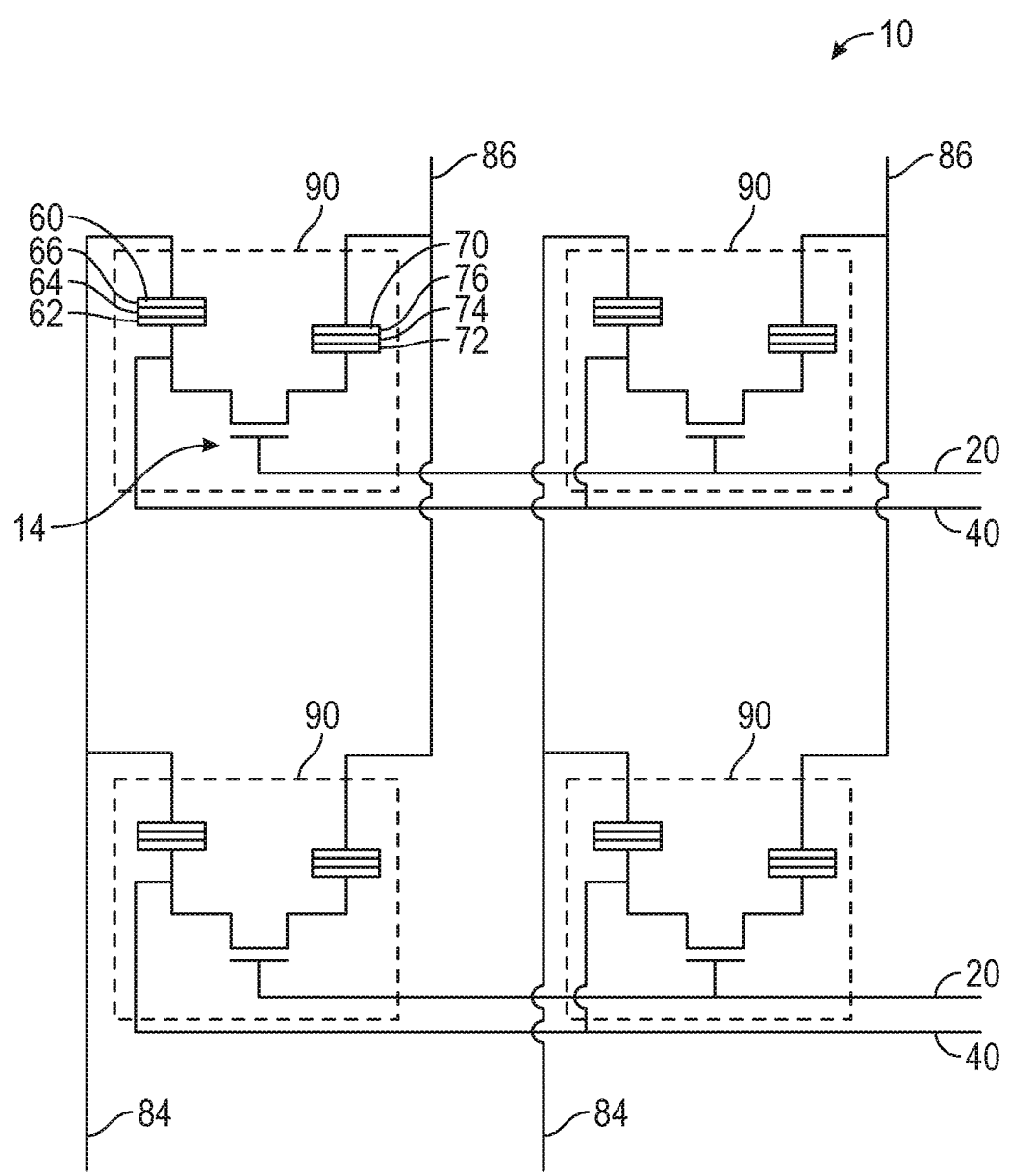
FIG. 8 is a partial circuit diagram of an embodiment of an integrated circuit.

An exemplary circuit diagram is provided in FIG. 8. FIG. 8 illustrates four memory cells 90 with the associated first source line 40, second source line 84, bit line 86, and the gate 20 which functions as the word line in the illustrated embodiment. The different memory cells 90 may be operated as indicated in Table 1, below, where "SV" means "set voltage," and "RV" means "reset voltage." The set voltage and reset voltage may vary for different types of resistive memory units, so no specific voltage is listed. Exemplary set voltages may be from about 1 to about 10 volts, and exemplary reset voltages may be from about 0.5 to about 5 volts, but other voltages are also possible. In an exemplary embodiment, the reset voltage is about half of the set voltage, but other ratios are also possible. The memory cell 90 is read by determining the resistance of the first and second resistive units 60, 70, and the resistance is determined by measuring the current through the memory cell 90 at a known voltage, as understood by those skilled in the art.

TABLE 1

|  | Set operation | Reset operation | Read operation |
| --- | --- | --- | --- |
| Word line (gate 20) | SV | SV | $V_{DD}$ |
| Bit line | 0 | 0 | 0.5* |
| First source line 40 | SV | RV | Float |
| Second source line 84 | 2* SV | 2* RV | 0 |

All values are voltages.
$V_{DD}$ is the positive supply voltage.
Float indicates no voltage bias is set.
SV = set voltage.
RV = reset voltage
*The "read operation" voltage of the Bit line is listed as 0.5 volts, but other voltages are also possible in alternate embodiments, such as 0.1 volts, 0.3 volts, etc. The "Read operation" voltage on the Bit line is less than the $V_{DD}$, and a wide variety of voltages may be utilized in various embodiments.

The first resistive unit 60 is positioned between the first source line 40 and the second source line 84. The second resistive unit 70 is positioned between the drain 18 and the bit line 86, where the drain 18 has the same voltage as the source 16 (and therefore the first source line 40) when the gate 20, which functions as the word line, is energized. The voltage across the first resistive unit 60 in the "set" operation is the difference between the second and first source lines 84, 40, or 2*SV−SV=SV. This is the set voltage, so the first resistive unit 60 is set at the applied set voltage. The voltage across the second resistive unit 70 in the set operation is the difference between the drain 18 (which is the same voltage as the source 16 because the gate 20 is energized) and the bit line 86, or SV−0=SV. Again, this is the set voltage, so the second resistive unit 70 is also set. The voltage across the first resistive unit 60 in the reset operation is 2*RV−RV=RV, which is the reset voltage. The voltage across the second resistive unit 70 in the reset operation is RV−0=RV, where the drain 18 has the same voltage as the source 16 because the gate 20 is energized.

Testing has demonstrated the cell window for a memory cell 90 as illustrated with a first and second resistive unit 60, 70 and a first and second source line 40, 84 may be about 1.9 times that of a different memory cell having one source line and one resistive unit, where the resistive units in the comparison memory cells have the same design. Utilization of different types of first and second resistive units 60, 70, where the first resistive unit 60 has a higher resistance than the second resistive unit 70, has been shown to increase the cell window up to about 2.7 times the cell window of a memory cell having one source line and one resistive unit, but other cell windows are also possible. The second source line 84 and the second resistive unit 70 are positioned vertically above the substrate 12, so the footprint of the memory cell 90 is about the same as for a comparable memory cell having a single resistive unit. The footprint is primarily determined by the footprint of the one transistor 14, and the memory cell 90 as described with a first and second resistive unit 60, 70 may have about the same size transistor 14 as that of a comparison memory cell having one resistive unit. Therefore, the cell window may be increased without increasing the footprint of a memory cell 90 having a first and a second resistive unit 60, 70 and a first and second source line 40, 84, as compared to a memory cell having a single resistive unit and a single source line.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
a memory cell including a transistor having a source and a drain, a first resistive unit in electrical communication with the source, and a second resistive unit in electrical communication with the drain, the first resistive unit including a first bottom electrode, a first top electrode, and a first resistive element positioned between the first bottom electrode and the first top electrode, the second resistive unit comprises a second bottom electrode, a second top electrode, and a second resistive element positioned between the second bottom electrode and the second top electrode, the first resistive element comprising a first resistive material, and the second resistive element comprising a second resistive material that is different than the first resistive material.

2. The integrated circuit of claim 1 further comprising:
a first source line in electrical communication with the source; and
a second source line,
wherein the first bottom electrode is in electrical communication with the first source line, the first top electrode is in electrical communication with the second source line, and the first source line and the second source line are electrically separated by the first resistive element.

3. The integrated circuit of claim 1 further comprising: a bit line,
wherein the second bottom electrode is in electrical communication with the drain, the second top electrode is in electrical communication with the bit line, and the bit line and the drain are electrically separated by the second resistive element.

4. The integrated circuit of claim 1 wherein the first resistive material and the second resistive material are selected from the group consisting of nickel oxide, titanium oxide, zinc oxide, zirconium oxide, hafnium oxide, and combinations thereof.

5. The integrated circuit of claim 1 wherein the first resistive element has a first high resistance and a first low resistance, the second resistive element has a second high resistance and a second low resistance, and the first high resistance is different than the second high resistance.

6. The integrated circuit of claim 1 further comprising:
a drain connection line containing an electrical conductor, wherein the drain connection line is in electrical communication with the drain and with the second bottom electrode.

7. The integrated circuit of claim 1 further comprising:
a first interlayer dielectric layer;
a second interlayer dielectric layer;
a first source line in electrical communication with the source, the first source line positioned in the first interlayer dielectric layer; and
a second source line positioned in the second interlayer dielectric layer.

8. The integrated circuit of claim 7 wherein the second source line overlies the first source line.

9. An integrated circuit comprising:
a memory cell including a transistor having a source and a drain, a first resistive unit in electrical communication with the source, and a second resistive unit in electrical communication with the drain, the first resistive unit including a first bottom electrode, a first top electrode, and a first resistive element positioned between the first bottom electrode and the first top electrode, the second resistive unit comprises a second bottom electrode, a second top electrode, and a second resistive element positioned between the second bottom electrode and the second top electrode,
wherein the first resistive unit and the second resistive unit are within the same interlayer dielectric layer.

10. The integrated circuit of claim 1 wherein the first top electrode primarily includes platinum, the first resistive element primarily includes nickel oxide, and the first bottom electrode primarily includes platinum.

11. The integrated circuit of claim 1 wherein the second top electrode primarily includes platinum, the second resistive element primarily includes zinc oxide, and the second bottom electrode primarily includes titanium nitride.

12. The integrated circuit of claim 9 wherein the first resistive element comprises a first resistive material, and the second resistive element comprises a second resistive material that is the same as the first resistive material.

13. An integrated circuit comprising:
a memory cell comprising a transistor having a source and a drain, a first resistive unit, and a second resistive unit, the first resistive unit including a first resistive element comprising a first resistive material, and the second resistive unit including second resistive element comprising a second resistive material that is different than the first resistive material;
a first source line;
a second source line; and
a bit line,
wherein the first resistive unit is in electrical communication with the first source line and with the second source line, the first source line is in electrical communication with the source, and the second resistive unit is in electrical communication with the drain and with the bit line.

14. The integrated circuit of claim 13 wherein the second source line overlies the first source line.

15. The integrated circuit of claim 13 further comprising:
a drain connection line in electrical communication with the drain and the second resistive unit.

16. The integrated circuit of claim 13 wherein the first resistive unit comprises a first bottom electrode and a first top electrode, the first resistive element is positioned between the first bottom electrode and the first top electrode, the first top electrode is in electrical communication with the second source line, and the first bottom electrode is in electrical communication with the first source line.

17. The integrated circuit of claim 13 wherein the second resistive unit comprises a second bottom electrode and a second top electrode, the second resistive element is sandwiched between the second bottom electrode and the second top electrode, the second top electrode is in electrical communication with the bit line, and the second bottom electrode is in electrical communication with the drain.

18. The integrated circuit of claim 16 wherein the first top electrode primarily includes platinum, the first resistive element primarily includes nickel oxide, and the first bottom electrode primarily includes platinum.

19. The integrated circuit of claim 17 wherein the second top electrode primarily includes platinum, the second resistive element primarily includes zinc oxide, and the second bottom electrode primarily includes titanium nitride.

20. The integrated circuit of claim 13 wherein the first resistive material and the second resistive material are selected from the group consisting of nickel oxide, titanium oxide, zinc oxide, zirconium oxide, hafnium oxide, and combinations thereof.

* * * * *